(12) United States Patent
Zang et al.

(10) Patent No.: US 9,431,396 B2
(45) Date of Patent: Aug. 30, 2016

(54) SINGLE DIFFUSION BREAK WITH IMPROVED ISOLATION AND PROCESS WINDOW AND REDUCED COST

(71) Applicant: GLOBALFOUNDRIES Inc., Grand Cayman (KY)

(72) Inventors: Hui Zang, Albany, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,564

(22) Filed: Jan. 30, 2015

(65) Prior Publication Data

US 2016/0225762 A1  Aug. 4, 2016

(51) Int. Cl.
| | | |
|---|---|---|
| H01L 21/76 | (2006.01) | |
| H01L 29/78 | (2006.01) | |
| H01L 27/088 | (2006.01) | |
| H01L 29/10 | (2006.01) | |
| H01L 21/8234 | (2006.01) | |
| H01L 21/762 | (2006.01) | |
| H01L 21/3213 | (2006.01) | |
| H01L 21/02 | (2006.01) | |
| H01L 27/02 | (2006.01) | |
| H01L 21/28 | (2006.01) | |
| H01L 29/66 | (2006.01) | |
| H01L 29/417 | (2006.01) | |

(52) U.S. Cl.
CPC ....... *H01L 27/0886* (2013.01); *H01L 21/0217* (2013.01); *H01L 21/28035* (2013.01); *H01L 21/32139* (2013.01); *H01L 21/76224* (2013.01); *H01L 21/823431* (2013.01); *H01L 21/823437* (2013.01); *H01L 21/823475* (2013.01); *H01L 27/0207* (2013.01); *H01L 29/1083* (2013.01); *H01L 29/41758* (2013.01); *H01L 29/66545* (2013.01)

(58) Field of Classification Search
CPC ..................... H01L 21/76224; H01L 21/0217
USPC .................................. 257/368; 438/296, 586
See application file for complete search history.

(56) References Cited

U.S. PATENT DOCUMENTS

| | | | | |
|---|---|---|---|---|
| 8,846,491 | B1* | 9/2014 | Pham | H01L 21/76224 257/E21.409 |
| 2013/0043535 | A1* | 2/2013 | Anderson | H01L 21/84 257/347 |
| 2015/0294969 | A1* | 10/2015 | Lee | H01L 27/0886 257/401 |
| 2015/0318213 | A1* | 11/2015 | Tsai | H01L 21/823462 257/9 |

* cited by examiner

*Primary Examiner* — Cuong Q Nguyen
*Assistant Examiner* — Tong-Ho Kim
(74) *Attorney, Agent, or Firm* — Ditthavong & Steiner, P.C.

(57) ABSTRACT

Methods of forming a SDB with a partial or complete insulator structure formed over the SDB and resulting devices are provided. Embodiments include forming a SDB with a first width in a substrate; forming a first metal gate in an ILD on top of the SDB, with a second width larger than the first width; forming second and third metal gates in the ILD on the substrate on opposite sides of the first metal gate, the second and third metal gates laterally separated from the first metal gate; forming a photoresist over the second and third gates; removing the first metal gate down to the SDB, forming a cavity; removing the photoresist; and filling the cavity with an insulator layer.

5 Claims, 13 Drawing Sheets

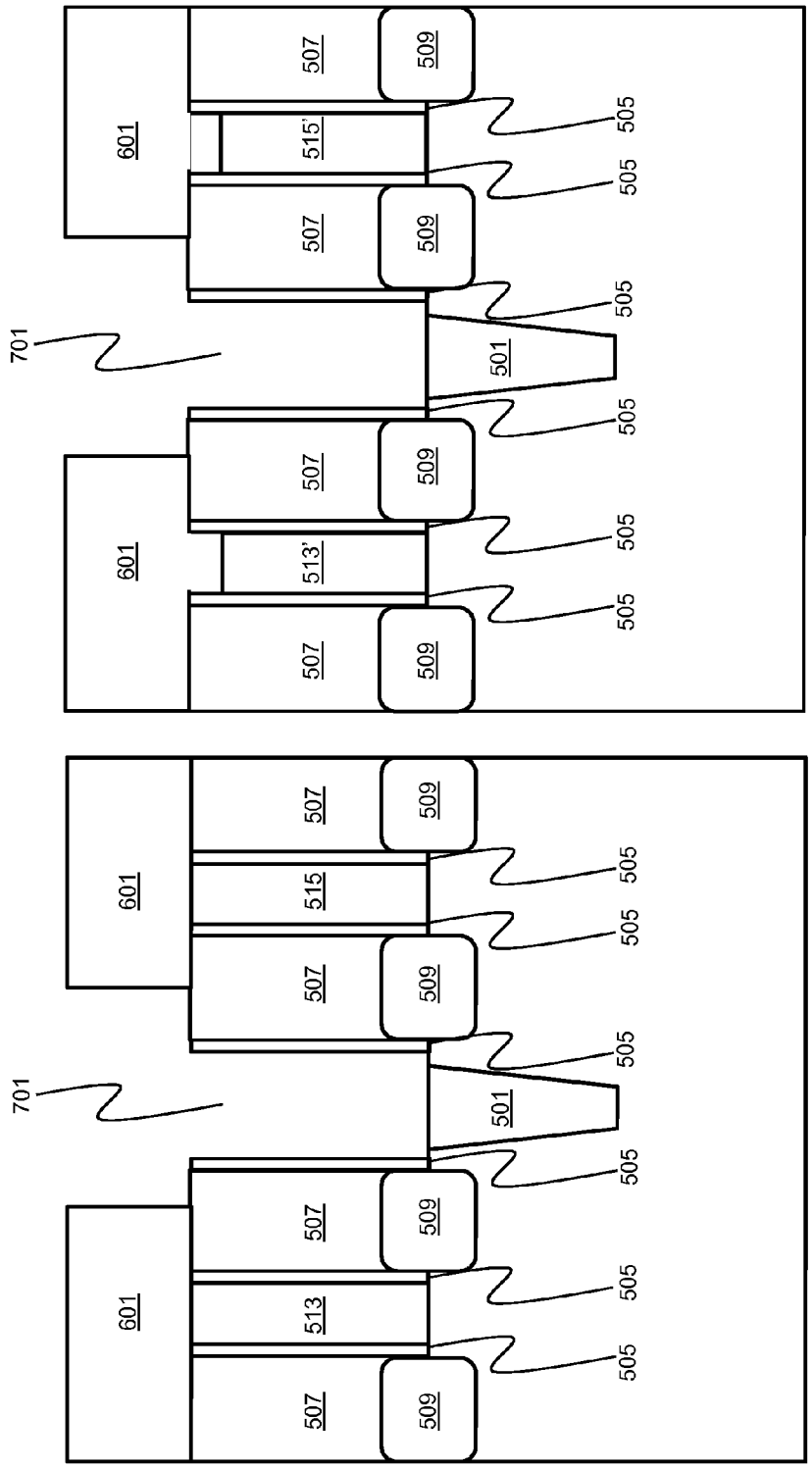

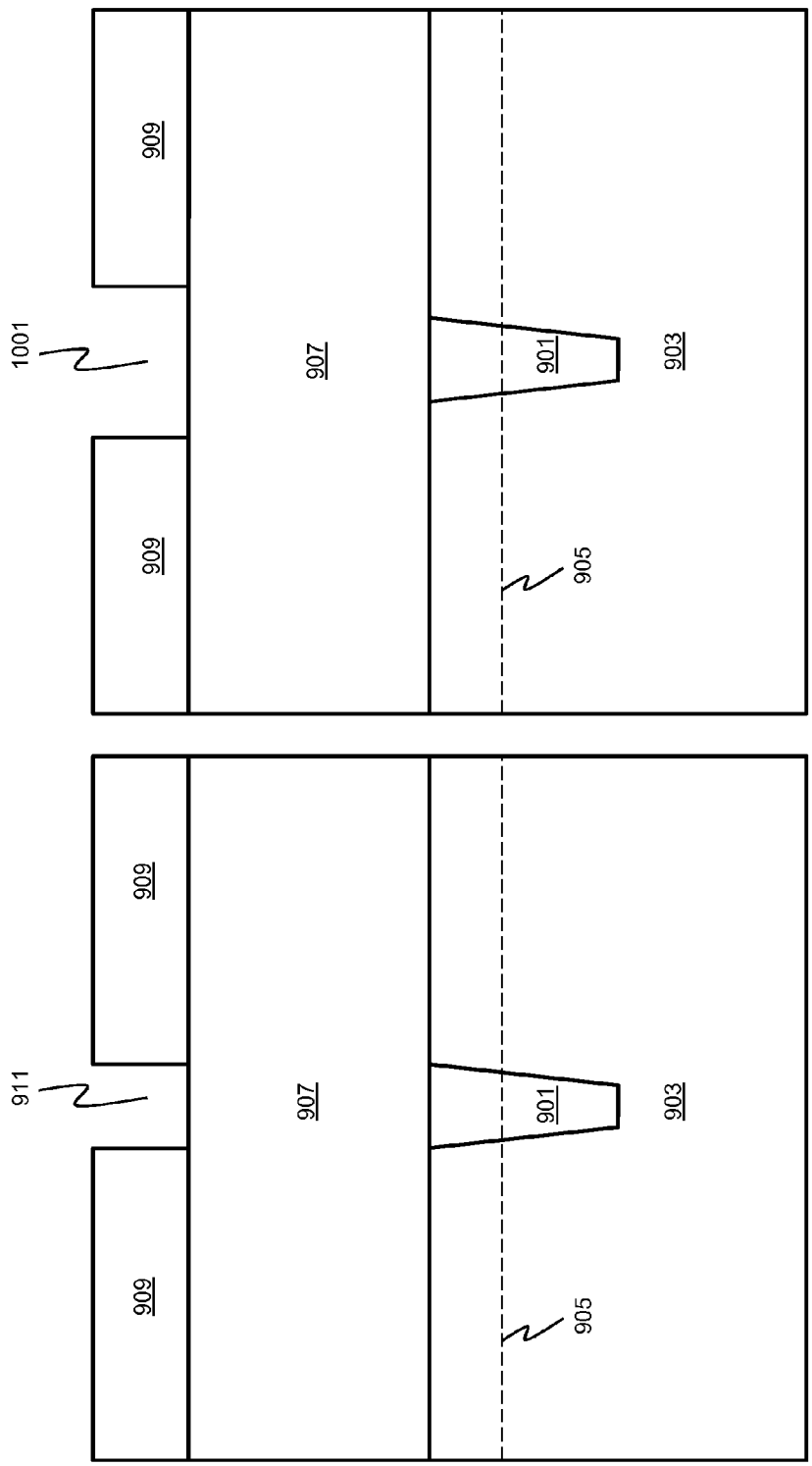

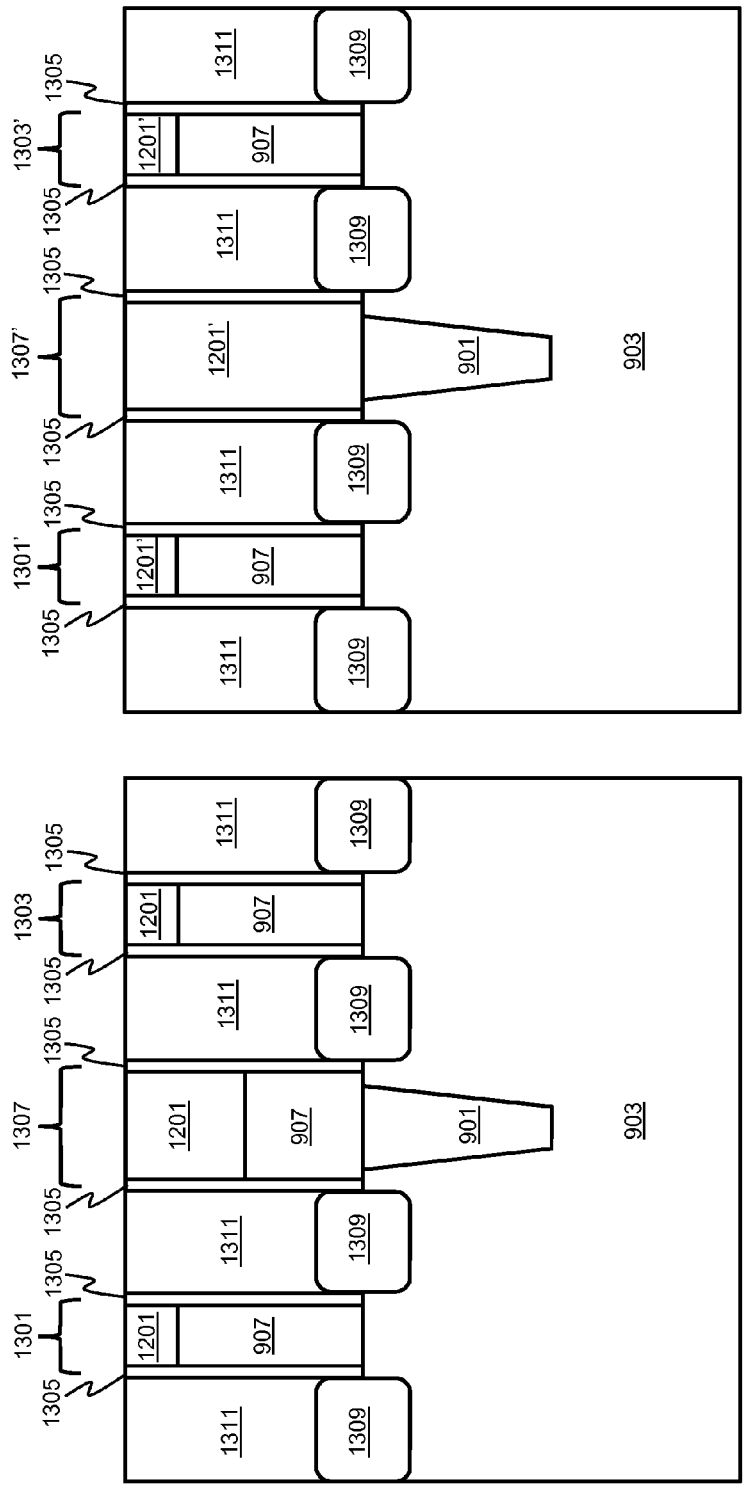

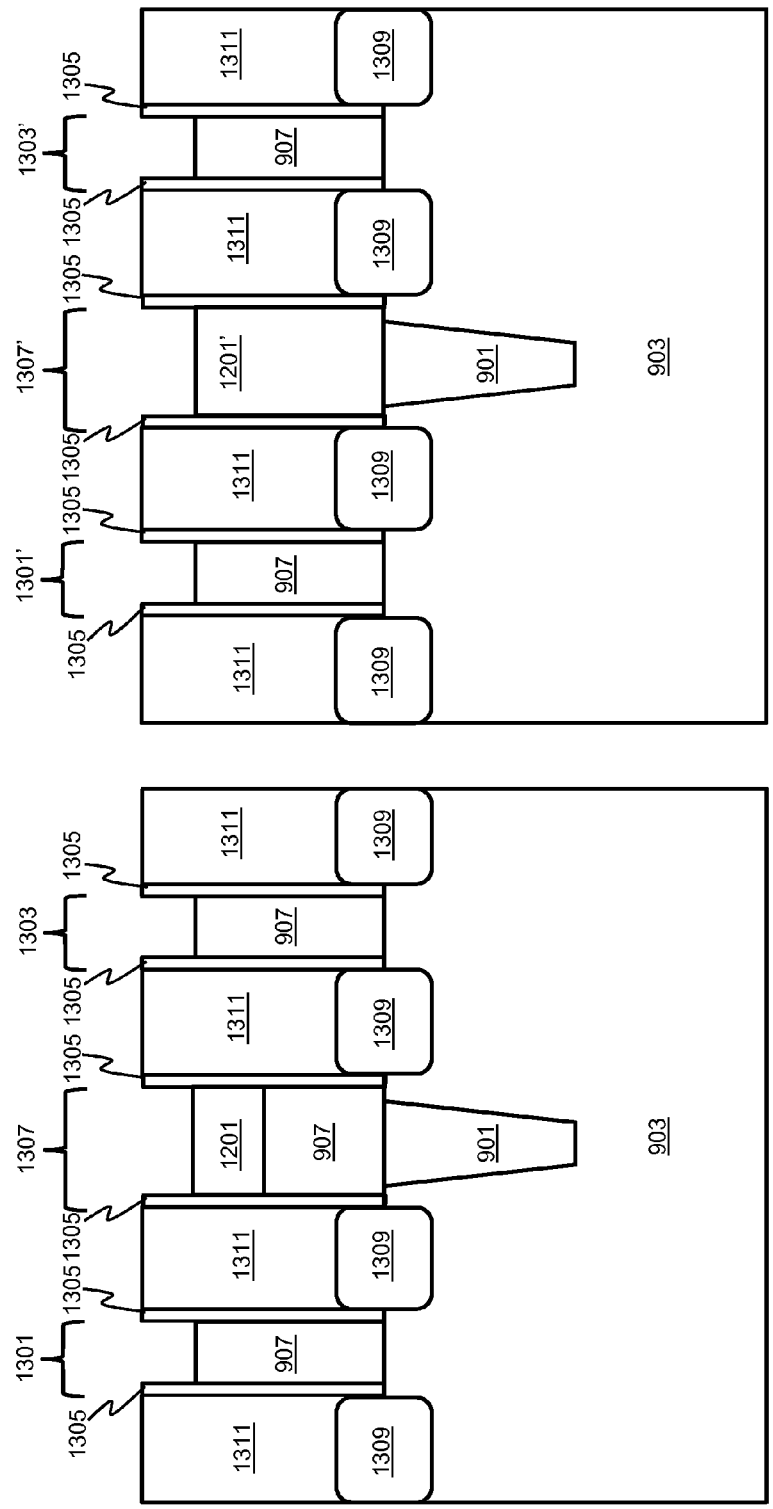

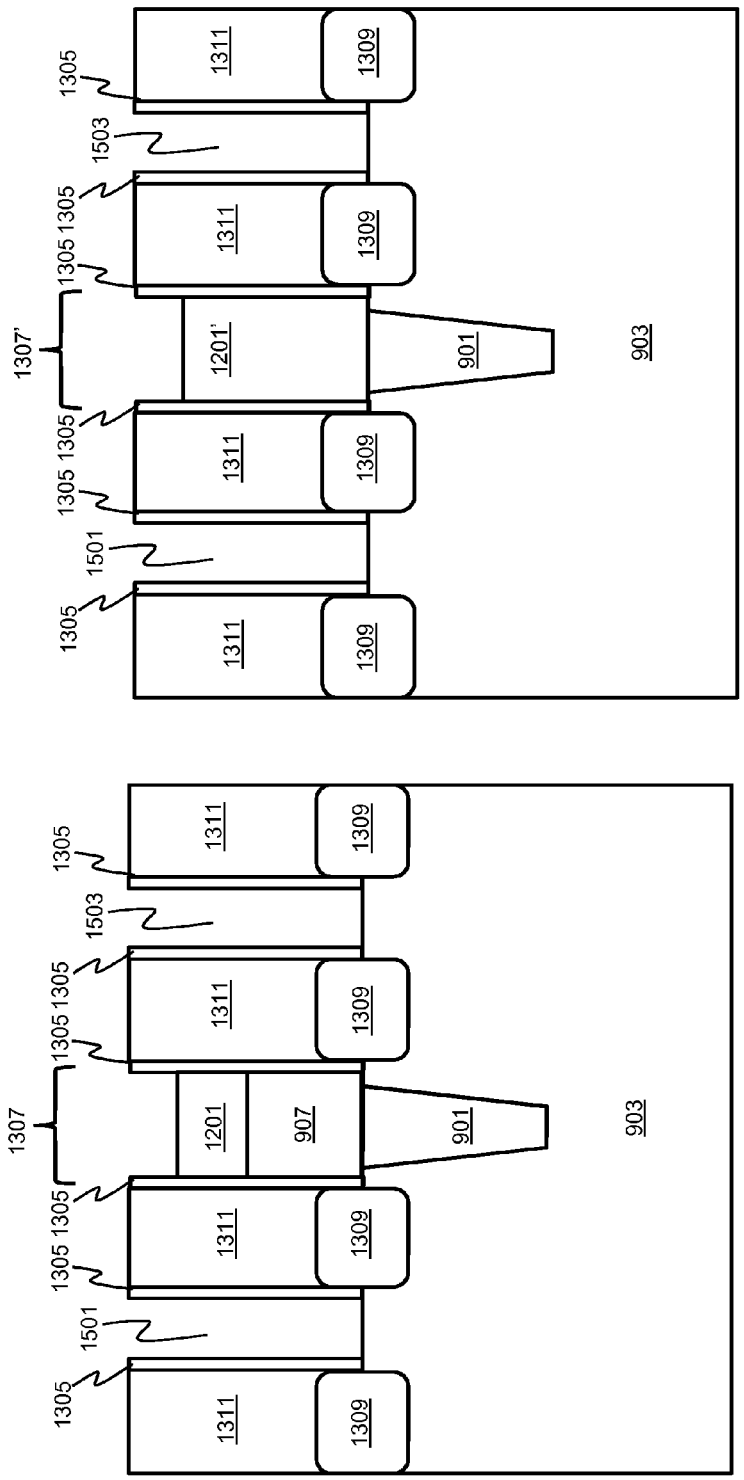

SINGLE DIFFUSION BREAK WITH IMPROVED ISOLATION AND PROCESS WINDOW AND REDUCED COST

TECHNICAL FIELD

The present disclosure relates to an isolation structure formation for fin-type field effect transistor (FinFET) devices. The present disclosure is particularly applicable to the formation of a single diffusion break (SDB).

BACKGROUND

Use of an SDB is a requirement of technology scaling. An SDB can be used to reduce the circuit area to enable the formation of high-density integrated circuits. However, SDB formation is very challenging with little process margin. The SDB must cover both edges of the active area. In current SDB designs, the gate spacers must cover the active area edges. Enlarging the gate would cause active area to active area leakage. One attempt to form an SDB with sufficient edge coverage includes a SDB formed in a silicon (Si) substrate using a hard mask, as depicted in FIGS. 1 through 4. Adverting to FIG. 1, a structure 101, e.g., formed of silicon oxide ($SiO_2$), is formed in a Si substrate 103. A hard mask 105, e.g., formed of silicon nitride (SiN), is then formed over the structure 101 and the Si substrate 103. An opening 107 above the structure 101 is then formed in the hard mask 105 using a lithography mask (not shown for illustrative convenience), as depicted in FIG. 2. The opening 107 enables a portion of the Si substrate 103 to be removed and, therefore, a corresponding portion of the structure 101 to be revealed. Adverting to FIG. 3, a structure 109, e.g., formed of the same material as the structure 101, is deposited over the structure 101 and then planarized, e.g., by chemical mechanical polishing (CMP), down to the hard mask 105. Thereafter, the hard mask 105 is removed and the resulting SDB structure 111 is formed, as depicted in FIG. 4. However, such designs can cause damage to the fin of the Si substrate 103 due to the selectivity of $SiO_2$ to Si, which has the risk of fin to dummy gate (PC) short.

A need therefore exists for methodology enabling formation of a SDB with robust isolation characteristics and/or formation of a SDB with fewer lithography masks and, therefore, lower cost and the resulting devices.

SUMMARY

An aspect of the present disclosure is a method of forming a SDB with an insulator structure formed over the SDB by forming a metal gate and replacing it with an insulator structure that is wider than the metal gate.

An additional aspect of the present disclosure is a method of forming a SDB with a partial or complete insulator structure formed over the SDB by replacing at least a portion of a dummy gate with the insulator structure.

Another aspect of the present disclosure is a SDB device including an insulator structure having a width greater than the width of the SDB formed over the SDB.

A further aspect of the present disclosure is a device including a partial or complete insulator structure formed over the SDB having a width greater than the width of the SDB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a SDB with a first width in a substrate; forming a first metal gate in an interlayer dielectric (ILD) on top of the SDB, with a second width larger than the first width; forming second and third metal gates in the ILD on the substrate on opposite sides of the first metal gate, the second and third metal gates laterally separated from the first metal gate; forming a photoresist over the second and third gates; removing the first metal gate down to the SDB, forming a cavity; removing the photoresist; and filling the cavity with an insulator layer.

Aspects of the present disclosure include forming each of the second and third metal gates to a third width smaller than the second width. Other aspects include etching each of the first, second, and third metal gates, forming a recess in each, prior to forming the photoresist; and filling the recess in each of the second and third metal gates with the insulator layer concurrently with filling the cavity. Further aspects include when source/drain (S/D) regions are formed on the substrate at opposite sides of each of the second and third metal gates, forming a self-aligned contact (SAC) through the ILD down to the source/drain regions. Additional aspects include forming the insulator layer of SiN.

Another aspect of the present disclosure is a device including: a SDB having a first width formed in a substrate; first and second metal gates, each with spacers at opposite sides thereof, formed on the substrate on opposite sides of the SDB, the first and second metal gates laterally separated from the SDB; an ILD between the first and second metal gates, the ILD having a cavity with a second width larger than the first width above and down to the SDB; an insulator layer formed in the cavity; and S/D regions formed on the substrate on opposite sides of each of the first and second metal gates.

Aspects of the device include the first and second metal gates each formed with a third width smaller than the second width. Other aspects include the insulator layer being formed of SiN. Further aspects include a self-aligned contact being formed through the ILD down to the S/D regions.

An additional aspect of the present disclosure is a method including: forming a SDB with a first width in a substrate; forming a poly layer over the substrate; etching a recess in the poly layer over the SDB, the recess having a second width greater than the first width; forming a nitride layer over the poly layer and filling the recess; etching the poly layer forming first and second poly gates at opposite sides of and laterally separated from the SDB and forming a structure over the SDB having the second width and including the nitride layer filled recess; forming an ILD around the first and second poly gates and around the structure; and replacing the first and second poly gates with first and second metal gates, respectively.

Aspects of the present disclosure include forming the recess in the poly layer by: forming a photoresist layer on the poly layer, the photoresist layer having an opening above the SDB; enlarging the opening to the second width; and etching the poly layer through the enlarged opening. Other aspects include etching the recess in the poly layer to a depth of 10 nm to 200 nm. Further aspects include forming each of the first and second poly gates to a third width less than the second width. Additional aspects include forming a SAC through the ILD down to the S/D regions. Another aspect includes recessing each of the first and second metal gates and the nitride layer and filling the recesses with a second nitride prior to forming the SAC.

A further aspect of the present disclosure is a device including: a SDB with a first width formed in a substrate; a structure over the SDB, with a second width larger than the first width; first and second metal gates formed on opposite sides of the structure, the first and second metal gates each having a third width smaller than the second width and being laterally separated from the insulator structure; S/D regions formed on the substrate on opposite sides of each of the first and second metal gates; an ILD around the first and second metal gates and around the structure and over the S/D regions, wherein the structure comprises a nitride layer. Aspects of the device include the structure being formed of poly silicon under the nitride layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 5A through 8A schematically illustrate a process flow for forming a SDB with an insulator structure formed over the SDB, in accordance with an exemplary embodiment;

FIGS. 5B through 8B schematically illustrate a process flow for forming a SDB with an insulator structure formed over the SDB and SACs over the source/drain regions, in accordance with an exemplary embodiment;

FIGS. 9, 10, and 11A through 16A schematically illustrate a process flow for forming a SDB with a partial insulator structure formed over the SDB, in accordance with another exemplary embodiment;

FIGS. 9, 10, and 11B through 16B schematically illustrate a process flow for forming a SDB with a complete insulator structure formed over the SDB, in accordance with another exemplary embodiment.

DETAILED DESCRIPTION

Figure 1:
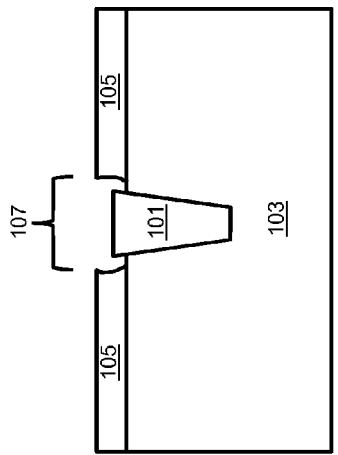
FIGS. 1 through 4 schematically illustrate a process flow of a background method of forming a SDB with a lithography mask.
Figure 2:
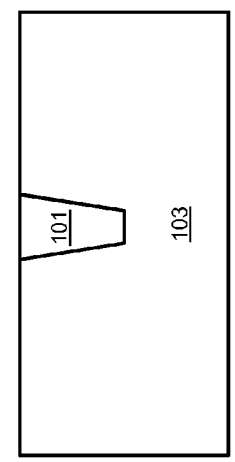
Figure 3:
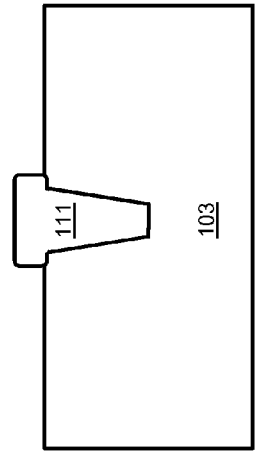
Figure 4:
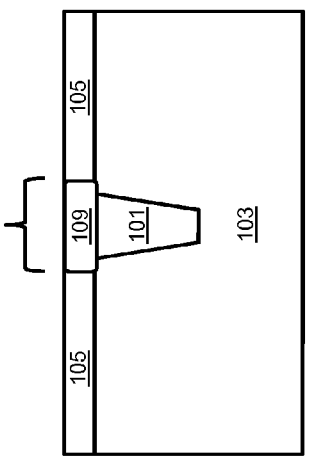

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of fin to PC shorts, fin to fin shorts, or unperfected epitaxy profile at the end of the fin and costly lithography masks attendant upon forming an SDB.

Methodology in accordance with embodiments of the present disclosure includes a SDB formed with a first width in a substrate. A first metal gate is formed in an ILD on top of the SDB, with a second width larger than the first width. Second and third metal gates are formed in the ILD on the substrate on opposite sides of the first metal gate, the second and third metal gates laterally separated from the first metal gate and a photoresist is formed over the second and third gates. The first metal gate is removed down to the SDB, forming a cavity. The photoresist is removed and the cavity is filled with an insulator layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 5A through 8A schematically illustrate a process flow for forming a SDB with an insulator structure formed over the SDB, in accordance with an exemplary embodiment. Adverting to FIG. 5A, a SDB 501 is formed in a substrate 503. Dummy gates (not shown for illustrative convenience) and spacers 505 are formed on the substrate 503. Raised S/D regions 509 are formed on the substrate 503 on opposite sides of gate spacers 505. Next, an ILD layer 507 is formed on the substrate 503 around the dummy gates and spacers 505 over the S/D regions. The dummy gates are then replaced by metal gates 511, 513, and 515.

Figure 6B:
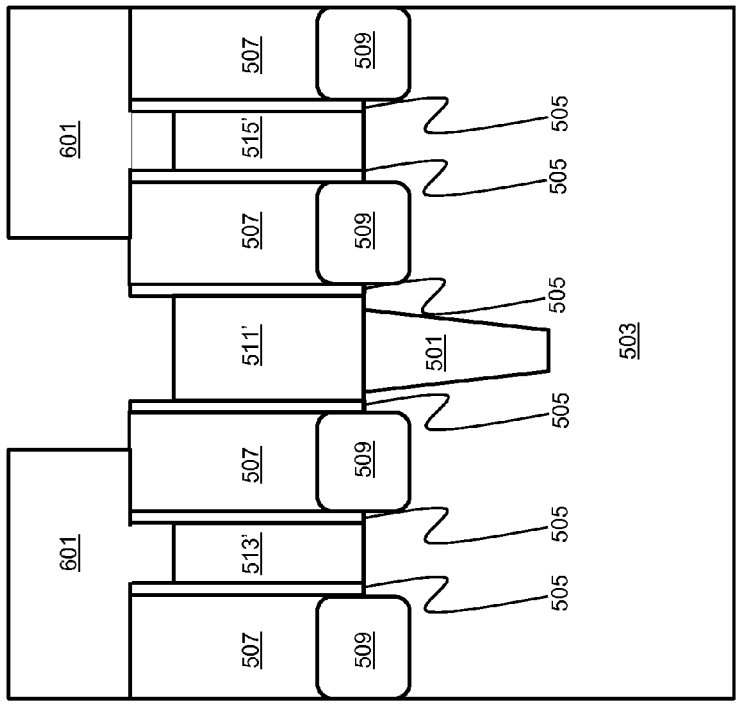
Figure 6A:
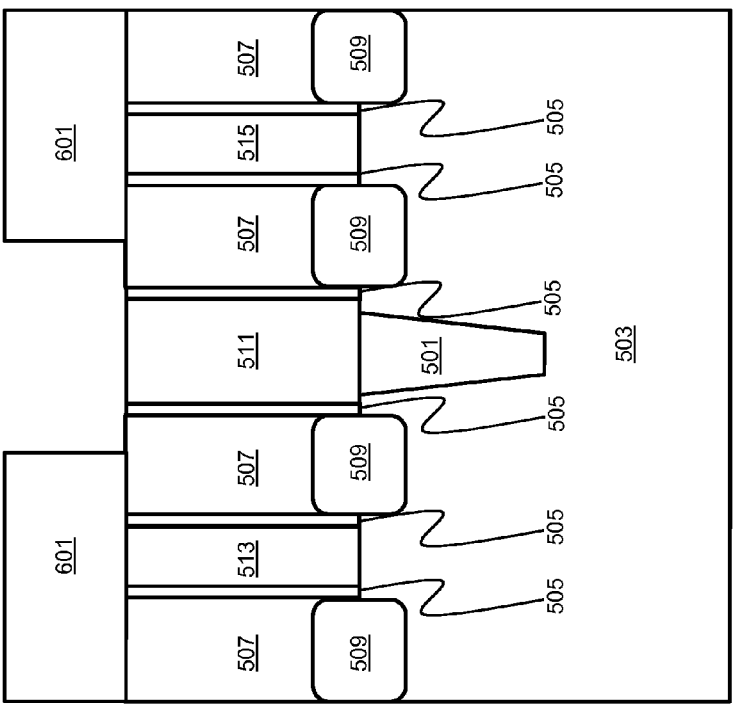
Figure 8B:
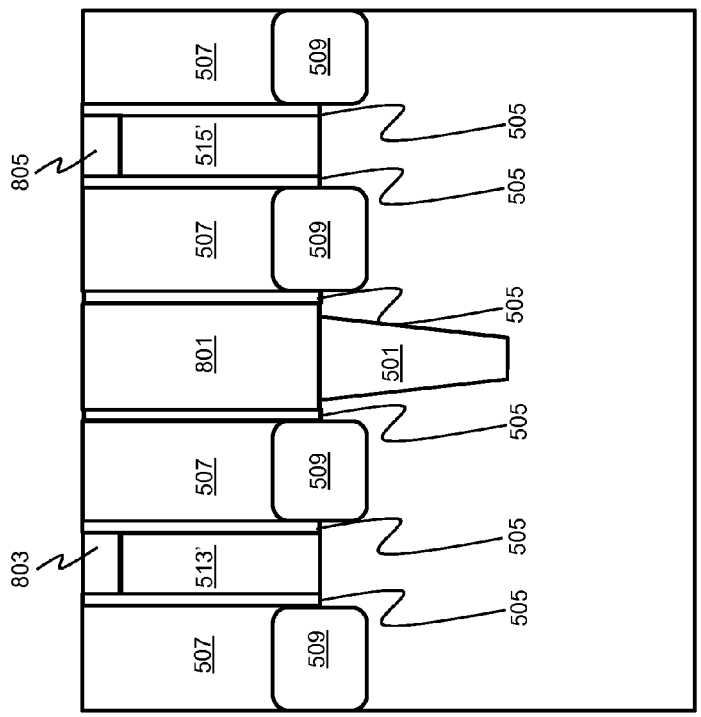
Figure 8A:
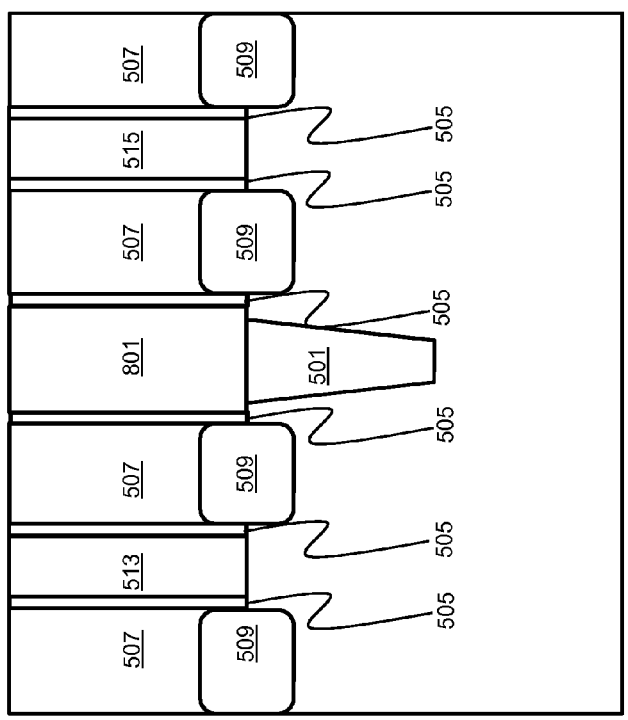

A photoresist layer 601 is then formed over the metal gates 513 and 515 with an opening over metal gate 511. The opening over metal gate 511 is then widened, as shown in FIG. 6A. Adverting to FIG. 7A, the metal gate 511 is removed, e.g., by etching, down to the SDB 501, forming the cavity 701. Thereafter, the photoresist layer 601 is removed, and the cavity 701 is filled with an insulator layer 801, which is then planarized, for example, by CMP, as depicted in FIG. 8A. The insulator layer 801 may be formed, for example, of SiN. The insulator layer 801 is formed with a width greater than the width of the SDB 501, and the metal gates 513 and 515 are formed with a width smaller than the width of the insulator layer 801. The increased width of the insulator layer 801 relative to the metal gates 513 and 515 can reduce the overlay effect.

Figure 5B:
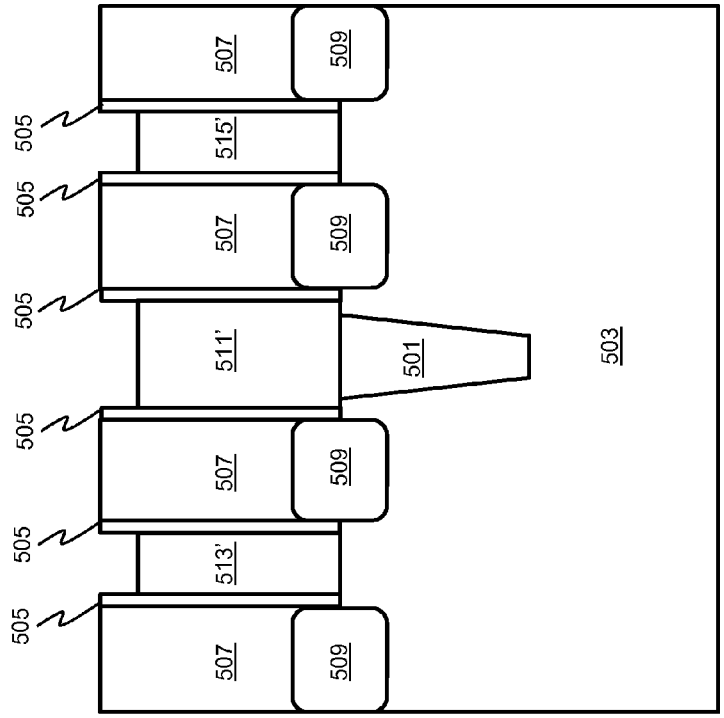
Figure 5A:
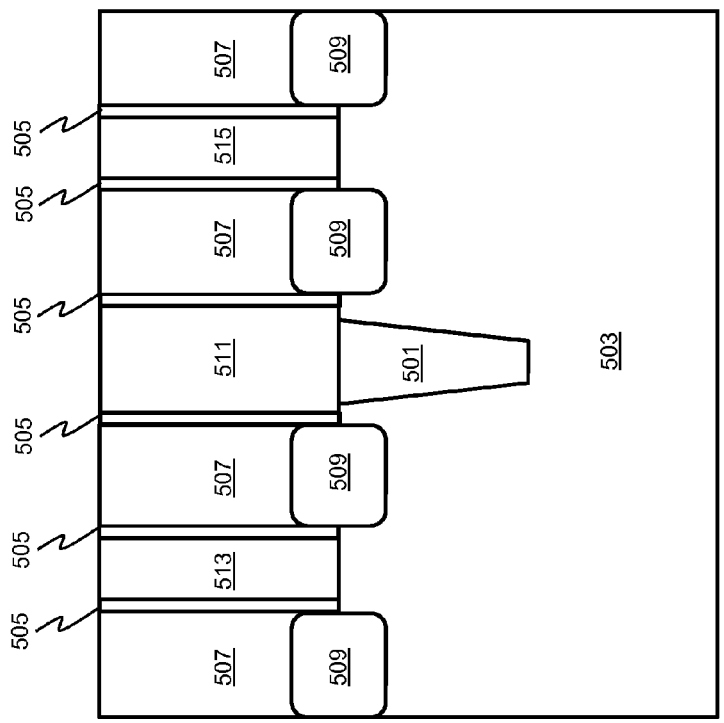

Alternatively, FIGS. 5B through 8B illustrate the process flow of FIGS. 5A through 8A where a SAC is intended to be formed. Specifically, the metal gates 511, 513, and 515 may be etched to recess the top portion of each gate, as illustrated in FIG. 5B, prior to forming photoresist 601, forming gates 511', 513', and 515'. When photoresist layer 601 is formed, it fills the recesses in metal gates 513' and 515', as illustrated in FIG. 6B. As illustrated in FIG. 7B, metal gate 511' is removed, e.g. by etching, forming cavity 701, as in FIG. 7A. Then, when insulator layer 801 is formed, the recesses in metal gates 513' and 515' are filled with the insulator layer 801 concurrently with filling the cavity 701, forming caps 803 and 805, respectively. Thereafter, a SAC (not shown for illustrative convenience) may be formed through the ILD layer 507 down to the raised S/D regions 509, without damaging metal gates 513' and 515'. In another embodiment, the steps of FIGS. 6A through 8A may be repeated with respect to a non-SDB region on the substrate, replacing dummy gates with an insulator structure, to achieve the same resulting benefits.

FIGS. 9, 10, and 11A through 16A schematically illustrate a process flow for forming a partial insulator structure over the SDB and FIGS. 9, 10, and 11B through 16B illustrate a process flow for forming a complete insulator structure over the SDB, in accordance with another exemplary embodiment. Adverting to FIG. 9, a SDB 901 is formed in the substrate 903. The area above the dotted line 905 represents a fin of the substrate 903. Next, a poly layer 907 is formed over the substrate 903. The poly layer 907 may be formed, for example, to a thickness of 50 nm to 200 nm. A photoresist layer 909 is then formed over the poly layer 907 with an opening 911 directly above the SDB 901. The opening 911 may be formed, for example, to a width of 10 nm to 80 nm. The opening 911 is then enlarged 5 nm to 20 nm, for example, to form the opening 1001, as depicted in FIG. 10. The opening 911 may be enlarged, for example, by photoresist trimming. The end width of the enlarged opening 1001 is greater than the width of the SDB 901.

Figure 11B:
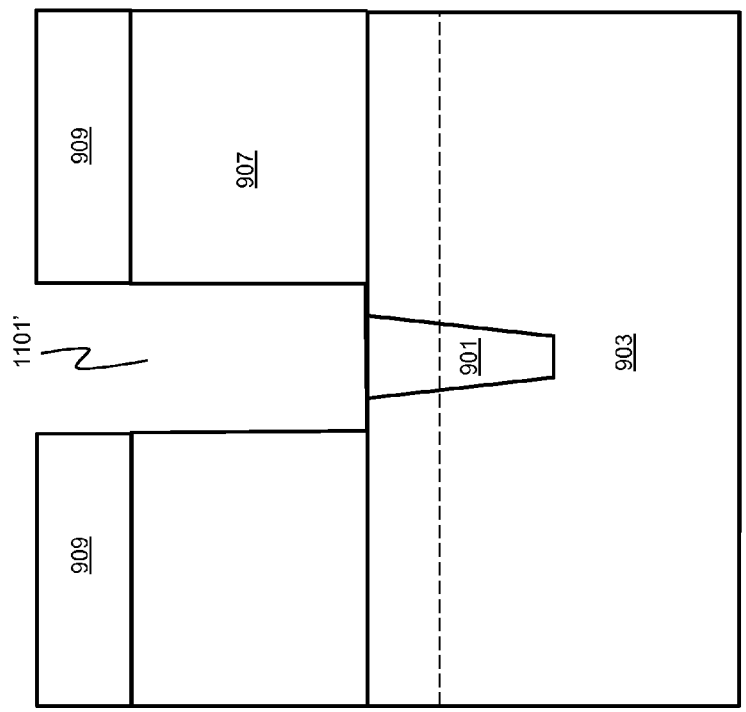
Figure 11A:
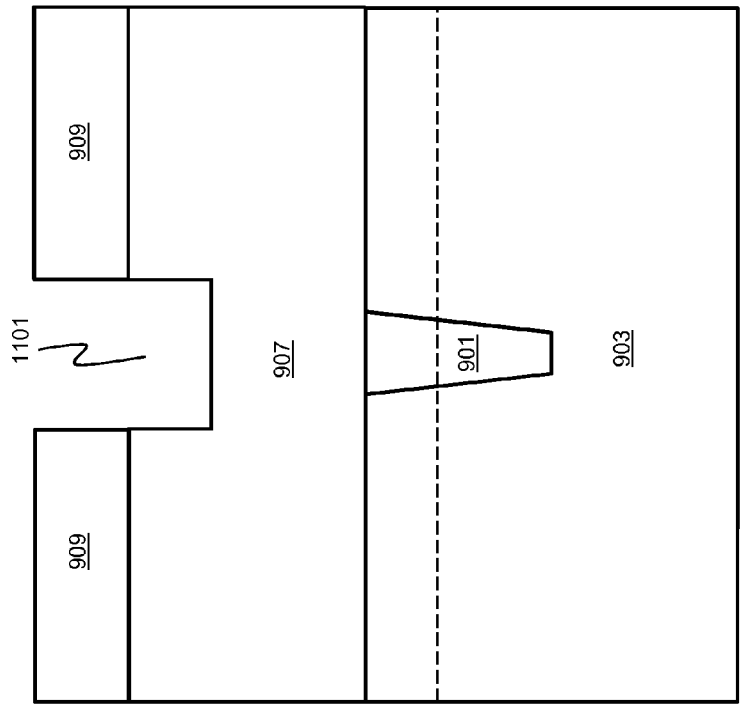
Figure 12A:
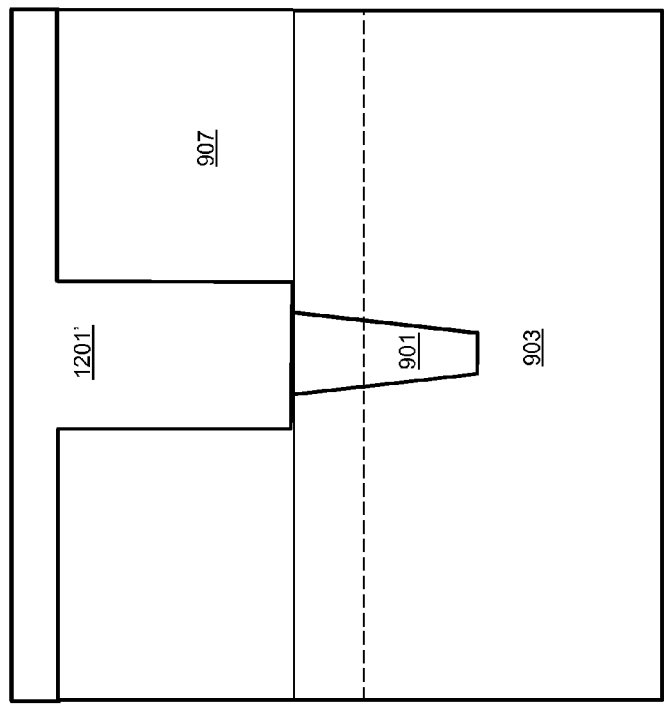
Figure 12B:
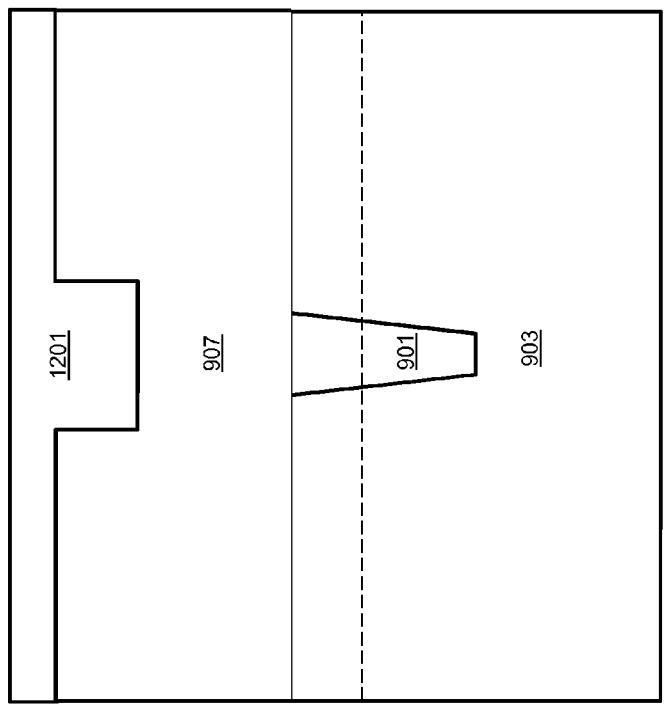

Adverting to FIG. 11A, the poly layer 907 is recessed through the enlarged opening 1001, forming recess 1101. The poly layer 907 may be recessed, for example, 10 nm to 200 nm, i.e., partially or completely down to the SDB 901. FIG. 11B illustrates a recess 1101' completely down to the SDB 901. Because the width of the enlarged opening 1001 is greater than the width of the SDB 901, the width of the recess 1101, or 1101', is also greater than the width of the SDB 901. Next, the photoresist layer 909 is removed and a nitride layer 1201, or 1201', is formed over the poly layer 907, filling the recess 1101, or 1101', respectively, as depicted in FIG. 12A or 12B, respectively. The nitride layer 1201, or 1201', is then planarized, for example, by CMP. The nitride layer 1201, or 1201', apart from the recess 1101, may be formed, for example, to a thickness of 10 nm to 80 nm.

The nitride layer 1201, or 1201', and the poly layer 907 are then etched to form poly gates 1301 and 1303, or 1301' and 1303', respectively, which are formed on opposite sides of and laterally separated from the SDB 901, as depicted in FIG. 13A or 13B, respectively. After the poly gates 1301 and 1303, or 1301' and 1303', respectively, are formed, spacers 1305 are formed, for example, by depositing a thin layer of nitride or a low-k material. At the same time, the structure 1307, or 1307', with spacers 1305 is formed. The width of the structure 1307, or 1307', is greater than the width of the SDB 901 and the width of the poly gates 1301 and 1303, or 1301' and 1303', respectively, is smaller than the width of the structure 1307, or 1307', respectively. Increasing the width of the structure 1307, or 1307', relative to the poly gates 1301 and 1303, or 1301' and 1303', respectively, can reduce the overlay effect. Next, raised S/D regions 1309 are formed on opposite sides of the poly gates 1301 and 1303, or 1301' and 1303', respectively, and then an ILD layer 1311 is formed around the poly gates 1301 and 1303, or 1301' and 1303', and the structure 1307, or 1307', respectively. In the case where the recess 1101' is formed all the way down to the SDB 901, the structure 1307' is completely filled with the nitride layer 1201' as illustrated in FIG. 13B.

Adverting to FIGS. 14A and 14B, the nitride layer 1201, or 1201', is removed, e.g., by etching, from on top of the poly structures 1301 and 1303, or 1301' and 1303', respectively, and an equal portion is simultaneously removed from on top of the structure 1307, or 1307', respectively. The poly gates 1301 and 1303, or 1301' and 1303', are then removed, for example, by etching, forming recesses 1501 and 1503, respectively, as depicted in FIGS. 15A and 15B. The nitride layer 1201 remaining on top of the poly layer 907 in the structure 1307 in FIG. 15A protects the poly layer 907 from being removed during removal of the poly layer 907 of the poly gates 1301 and 1303. Adverting to FIGS. 16A and 16B, metal gates 1601 and 1603 are formed in the recesses 1501 and 1503, respectively. The metal gates 1601 and 1603 may be formed, for example, to completely fill the recesses 1501 and 1503, respectively. Thereafter, a nitride layer 1605 may be formed over the structure 1307, or 1307'. The nitride layer 1605 is then planarized down to the ILD 1311, for example, by CMP.

Figure 16A:
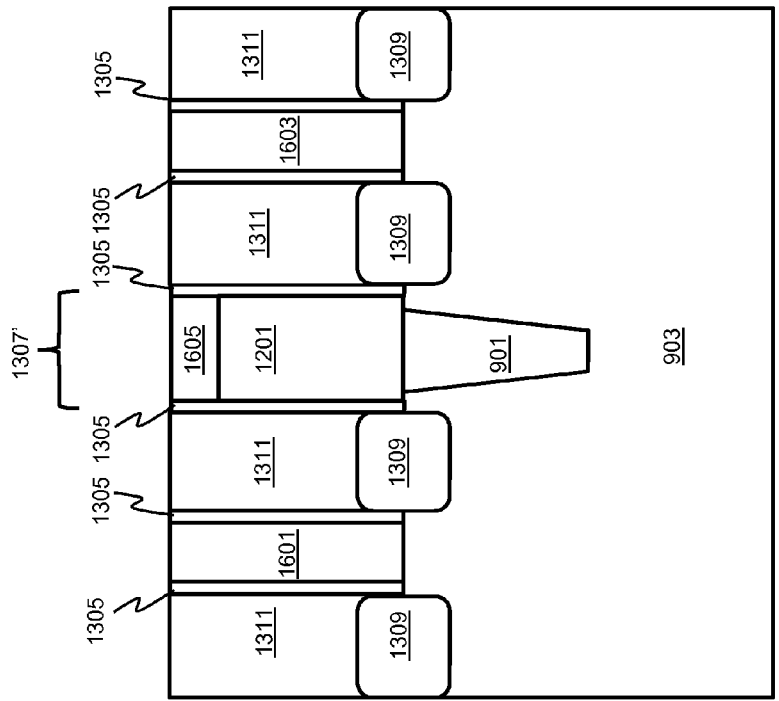
Figure 16B:
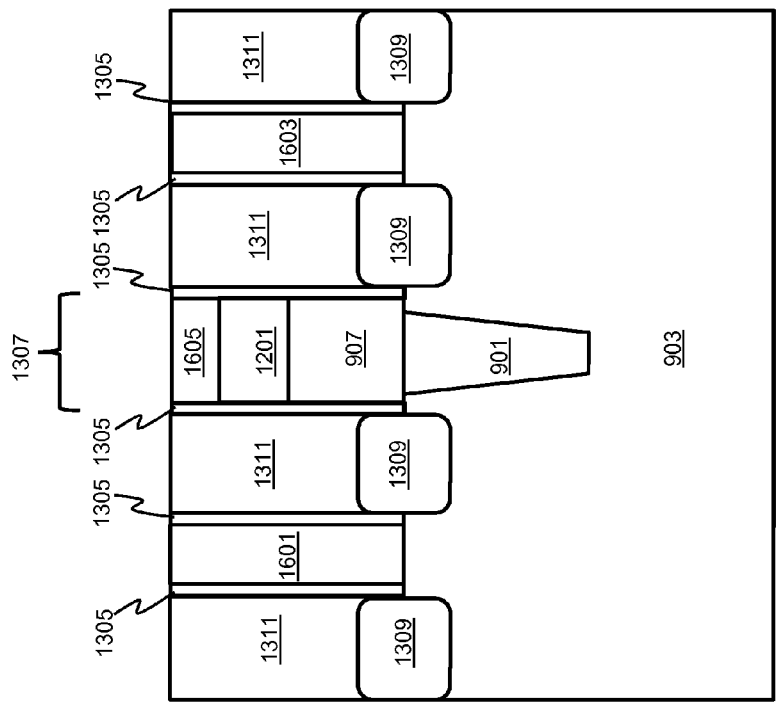
Figure 16D:
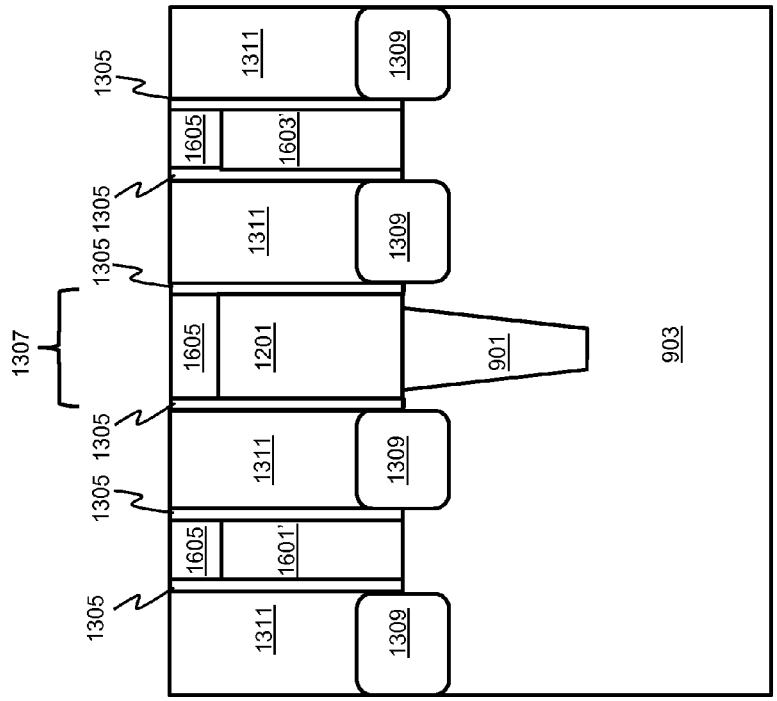
FIGS. 16C and 16D schematically illustrate the resulting structures of the process flows of FIGS. 9 through 16A and FIGS. 9 through 16B, respectively, when SACs are to be formed over the source/drain regions, in accordance with another exemplary embodiment.
Figure 16C:
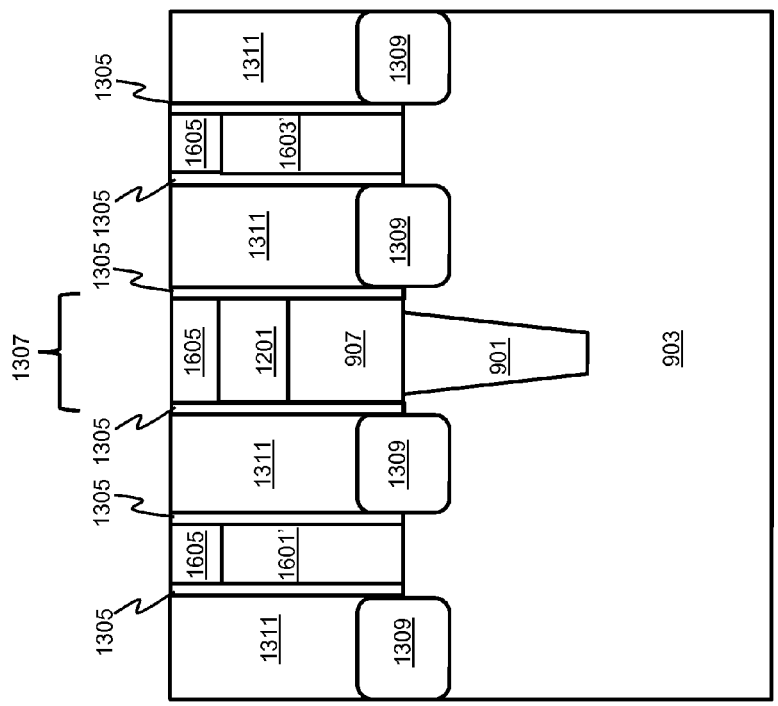

Alternatively, where a SAC is to be formed the metal gates 1601' and 1603' partially fill the recesses 1501 and 1503, respectively, as illustrated in FIGS. 16C and 16D. Then, when the nitride layer 1605 above the SBD 901 is formed, nitride layer 1605 also fills the recesses left above metal gates 1601 and 1603. Thereafter, a SAC (not shown for illustrative convenience) may be formed through the ILD layer 1311 down to the raised S/D regions 1309. In a further embodiment, the steps of FIGS. 8 through 16A or 16C may be repeated with respect to a non-SDB region on the substrate to achieve the same resulting benefits.

The embodiments of the present disclosure can achieve several technical effects including robust isolation characteristics and a lower cost formation. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a single diffusion break (SDB) with a first width in a substrate;
    forming a first metal gate in an interlayer dielectric (ILD) on top of the SDB, with a second width larger than the first width;
    forming second and third metal gates in the ILD on the substrate on opposite sides of the first metal gate, the second and third metal gates laterally separated from the first metal gate;
    forming a photoresist over the second and third gates;
    removing the first metal gate down to the SDB, forming a cavity;
    removing the photoresist; and
    filling the cavity with an insulator layer,
    wherein each of the second and third metal gates is formed to a third width smaller than the second width.

2. The method according to claim 1, further comprising:
etching each of the first, second, and third metal gates, forming a recess in each, prior to forming the photoresist; and
filling the recess in each of the second and third metal gates with the insulator layer concurrently with filling the cavity.

3. The method according to claim 2, wherein source/drain (S/D) regions are formed on the substrate at opposite sides of each of the second and third metal gates, the method further comprising forming a self-aligned contact through the ILD down to the source/drain regions.

4. The method according to claim 1, comprising forming the insulator layer of silicon nitride (SiN).

5. The method according to claim 1, wherein the insulator layer is formed with a width greater than the first width and each of the third widths is smaller than the width of the insulator layer.

\* \* \* \* \*